United States Patent [19]

Kawashima et al.

[11] 4,121,941

[45] Oct. 24, 1978

[54] LOW MICROWAVE LOSS CERAMICS AND METHOD OF MANUFACTURING THE SAME

[75] Inventors: Syunichiro Kawashima, Katano; Masamitsu Nishida; Ichiro Ueda, both of Osaka; Hiromu Ouchi, Toyonaka; Shigeru Hayakawa, Hirakata, all of Japan

[73] Assignee: Matsushita Electric Industrial Co., Ltd., Japan

[21] Appl. No.: 850,486

[22] Filed: Nov. 10, 1977

[51] Int. Cl.$^2$ ............................................. C04B 35/00
[52] U.S. Cl. .................................... 106/39.5; 106/46; 252/63.5; 333/83 R
[58] Field of Search ............. 106/39.5, 46; 333/83 R, 333/73; 252/521, 63.5

[56] References Cited

U.S. PATENT DOCUMENTS

| | | | |
|---|---|---|---|
| 3,464,785 | 9/1969 | Galasso | 252/63.5 X |
| 3,713,051 | 1/1973 | Kell | 333/83 R |

OTHER PUBLICATIONS

Galasso, F. S., "Structure, Properties and Preparation of Perovskite Type Compounds"–Pergamon Press–1969–pp. 149, 177.

*Primary Examiner*—Helen McCarthy
*Attorney, Agent, or Firm*—Wenderoth, Lind & Ponack

[57] ABSTRACT

Calcined material having a composition including at least two of the components $3BaO.ZnO.Nb_2O_5$, $3BaO.ZnO.Ta_2O_5$, $3BaO.MgO.Nb_2O_5$, and $3BaO.MgO.Ta_2O_5$ and produced under optimum processing conditions as disclosed is employed for obtaining ceramics having low microwave loss with large dielectric constant and suitable for use as dielectric resonators, electrical filters, substrates, etc.

10 Claims, 1 Drawing Figure

LOW MICROWAVE LOSS CERAMICS AND METHOD OF MANUFACTURING THE SAME

BACKGROUND OF THE INVENTION

The present invention relates to ceramics for use in electrical and electronic equipment and more particularly, to ceramics having high dielectric constant and low microwave loss and stability against temperature variations for use in various microwave circuits.

Conventionally, in the microwave frequency ranges, dielectrics have been applied for impedance matching in the microwave circuits and producing dielectric resonators, etc. Particularly, with the recent progress in the technique for integration of microwave circuits, there has been a strong demand for small-sized dielectric resonators as oscillator frequency stabilizer, frequency filters, etc., and also for materials having high dielectric constant and low microwave loss with sufficient stability against temperature variations to be used, for example, as substrates for integrated circuits.

Although alumina has been generally employed as a low loss dielectric material for use as substrates, the material has disadvantages such as the fact that relative dielectric constant thereof is small at approximately 10, with a large temperature coefficient of approximately 120 to 150 ppm/° C.

Meanwhile, as materials for dielectric resonators, various compositions, for example, compositions of the $BaO-TiO_2$ group, compositions prepared by substituting other elements for part of $BaO-TiO_2$ group, or compositions prepared by combining $TiO_2$, whose dielectric constant has negative temperature variation rate, with dielectric compositions whose dielectric constant has a positive temperature coefficient, have been mainly employed. The compositions as described above, however, still have drawbacks such as large dielectric loss, large temperature variations with respect to the dielectric constant, large deviations in the temperature variation rate of the dielectric constant, etc., thus presenting various problems in actual use.

Accordingly, an essential object of the present invention is to provide dielectric ceramics for use in electrical and electronic equipment which are large in dielectric constant, and small in loss with respect to microwaves, with sufficient stability against temperature variations.

Another important object of the present invention is to provide dielectric ceramics of the above described type which are simple in structure and stable in functioning and can be manufactured on a large scale at low cost.

A further object of the present invention is to provide a method of manufacturing dielectric ceramics of the above described type through simple processes.

In accomplishing these and other objects, according to the present invention, a calcined material having a composition including at least two of the components $3BaO.ZnO.Nb_2O_5$, $3BaO.ZnO.Ta_2O_5$, $3BaO.MgO.Nb_2O_5$, and $3BaO.MgO.Ta_2O_5$ and produced under optimum processing conditions as disclosed, is employed for obtaining ceramics having small microwave loss with large dielectric constant and suitable for use as dielectric resonators, electrical filters, substrates, etc. with substantial elimination of disadvantages inherent in the conventional ceramics and manufacturing method therefor.

BRIEF DESCRIPTION OF THE DRAWING

These and other objects and features of the present invention will become apparent from the following description taken in conjunction with the preferred embodiment thereof with reference to the accompanying drawing, in which, The FIGURE is an electrical block diagram depicting a circuit employed for measurements of dielectric characteristics of ceramics in the microwave frequency range.

DETAILED DESCRIPTION OF THE INVENTION

Figure 1:
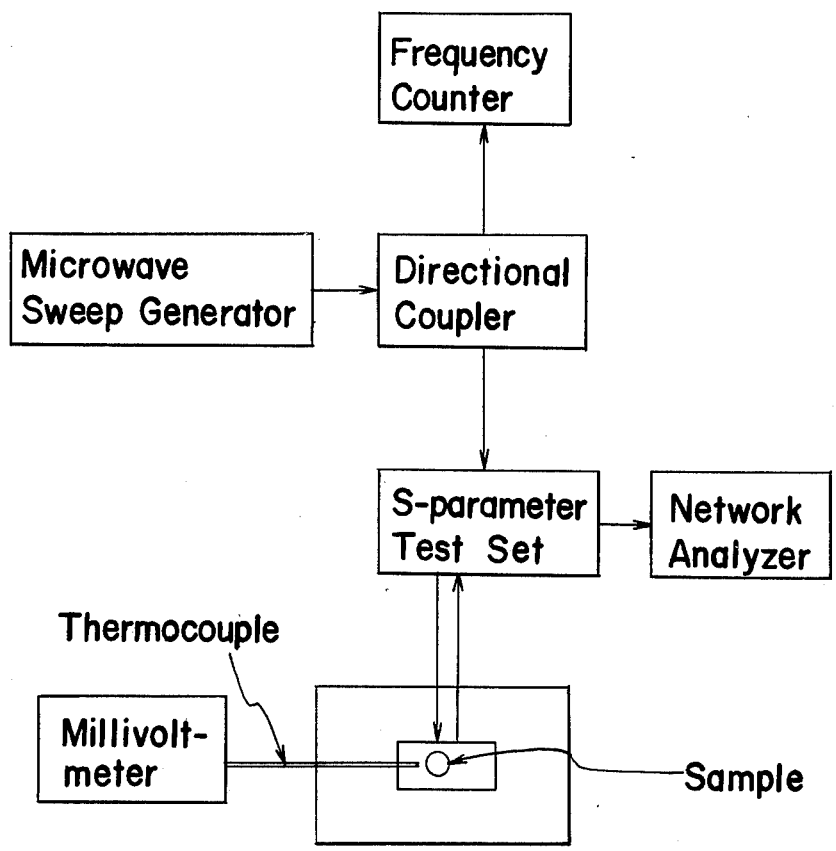

Referring now to the drawing, the present invention will be described in detail hereinbelow.

Through various experiments, the present inventors have found that compositions prepared from a proper combination of BaO, ZnO, MgO, $Nb_2O_5$, and $Ta_2O_5$ and calcined into dense ceramics have a high unloaded Q value and good stability with respect to temperature variations in the microwave frequencies. By properly altering the compositions, ceramics for use in microwave frequency range having superior characteristics of relative dielectric constants of 29 to 39, Q values of 3,900 to 4,300, and temperature coefficient of resonant frequency of 0 to 27 ppm/° C. can be obtained in the form of dielectric ceramics. Regarding the components $3BaO.ZnO.Nb_2O_5$, $3BaO.MgO.Nb_2O_5$, $3BaO.ZnO.Ta_2O_5$, and $3BaO.MgO.Ta_2O_5$, structual analysis thereof has been made, for example, in (1) F. Galasso et al. Nature, 207, 70(1965), (2) F. Galasso et al. Inorg. Chem., 2, 3, 482(1963), (3) F. Galasso et al. J. Phys. Chem., 67, 1561(1963), and (4) F. Galasso et al. J. Am Chem., Soc., 81, 820(1959), and therefore, reference may be made thereto for details thereof. Similarly, single crystals of such components have been prepared for investigation into their electrical characteristics thereof, but due to small size of such single crystals, it has been very difficult to put them into practical use.

In order to overcome the disadvantage as described above, the present inventors have prepared dense ceramics of the $BaO-ZnO-MgO-Nb_2O_5-Ta_2O_5$ group for measurements of electrical characteristics thereof in the microwave frequency range, and as a result, have found that the composition represented by formula $w(3BaO.ZnO.Nb_2O_5) - x(3BaO.ZnO.Ta_2O_5) - y(3BaO.MgO.Nb_2O_5) - z(3BaO.MgO.Ta_2O_5)$ has a high unloaded Q value in the microwave frequency range, and high temperature stability for the resonant frequency when formed into the dielectric resonator.

In Table 1, there are shown the relative dielectric constants K, unloaded Q values, and temperature coefficients of resonant frequency TCF in the form of dielectric resonators of the ceramics according to the present invention in the microwave frequency range.

Table 1

| Experiment Nos. | Composition (Mole Fraction) | | | | Hot-Pressing Temperature (° C) | K | Q | TCF (ppm/° C) |
|---|---|---|---|---|---|---|---|---|
| | w | x | y | z | | | | |
| *1 | 1.0 | | | | 1,300 | 40 | 3,485 | 28 |
| *2 | | 1.0 | | | 1,400 | 30 | 3,666 | −2 |
| *3 | | | 1.0 | | 1,200 | 29 | 3,800 | 24 |
| *4 | | | | 1.0 | 1,450 | 27 | 3,780 | 9 |
| 5 | 0.01 | 0.99 | | | 1,380 | 31 | 3,972 | 0 |
| 6 | 0.4 | 0.6 | | | 1,350 | 33 | 4,319 | 9 |
| 7 | 0.6 | 0.4 | | | 1,350 | 35 | 3,938 | 17 |
| 8 | 0.99 | 0.01 | | | 1,300 | 39 | 3,917 | 25 |

Table 1-continued

| Experiment Nos. | Composition (Mole Fraction) w | x | y | z | Hot-Pressing Temperature (°C) | K | Q | TCF (ppm/°C) |
|---|---|---|---|---|---|---|---|---|
| 9 | 0.01 | | 0.99 | | 1,200 | 31 | 4,111 | 24 |
| 10 | 0.4 | | 0.6 | | 1,250 | 34 | 4,237 | 25 |
| 11 | 0.6 | | 0.4 | | 1,250 | 35 | 4,150 | 24 |
| 12 | 0.99 | | 0.01 | | 1,300 | 38 | 4,020 | 27 |
| 13 | | 0.01 | | 0.99 | 1,430 | 28 | 4,033 | 7 |
| 14 | | 0.4 | | 0.6 | 1,420 | 28 | 4,270 | 5 |
| 15 | | 0.6 | | 0.4 | 1,420 | 29 | 4,214 | 4 |
| 16 | | 0.99 | | 0.01 | 1,400 | 30 | 3,950 | 0 |
| 17 | | | 0.01 | 0.99 | 1,430 | 27 | 4,047 | 11 |
| 18 | | | 0.4 | 0.6 | 1,400 | 28 | 4,253 | 15 |
| 19 | | | 0.6 | 0.4 | 1,350 | 29 | 4,221 | 19 |
| 20 | | | 0.99 | 0.01 | 1,200 | 29 | 4,125 | 22 |
| 21 | 0.97 | 0.01 | 0.01 | 0.01 | 1,330 | 29 | 4,228 | 11 |
| 22 | 0.01 | 0.97 | 0.01 | 0.01 | 1,370 | 30 | 4,257 | 20 |
| 23 | 0.01 | 0.01 | 0.97 | 0.01 | 1,300 | 31 | 4,125 | 5 |
| 24 | 0.01 | 0.01 | 0.01 | 0.97 | 1,400 | 37 | 4,037 | 23 |
| 25 | 0.25 | 0.25 | 0.25 | 0.25 | 1,380 | 34 | 4,111 | 12 |

Note *For comparison

Meanwhile, Table 2 shows variations of the unloaded Q value when manufacturing conditions for the ceramics according to the present invention are altered.

Table 2

| Composition (Mole Fraction) w | x | y | z | Hot-Pressing Temperature (°C) | Q Calcining Temperature (°C) 800* | 1,000 | 1,400 | 1,450* |
|---|---|---|---|---|---|---|---|---|
| 0.01 | 0.99 | | | 1,380 | 590 | 3,970 | 3,950 | 2,210 |
| 0.5 | 0.5 | | | 1,350 | 500 | 4,015 | 4,000 | 2,234 |
| 0.99 | 0.1 | | | 1,300 | 485 | 3,910 | 3,890 | 2,180 |
| 0.01 | | 0.99 | | 1,200 | 920 | 4,102 | 3,920 | 1,290 |
| 0.5 | | 0.5 | | 1,250 | 890 | 3,903 | 3,915 | 1,310 |
| 0.99 | | 0.01 | | 1,300 | 905 | 4,015 | 3,900 | 1,250 |
| | 0.01 | | 0.99 | 1,430 | 1,530 | 4,028 | 3,970 | 926 |
| | 0.5 | | 0.5 | 1,420 | 1,523 | 3,940 | 4,115 | 950 |
| | 0.99 | | 0.01 | 1,400 | 1,510 | 3,935 | 3,860 | 890 |
| | | 0.01 | 0.99 | 1,430 | 1,225 | 4,038 | 4,010 | 1,680 |
| | | 0.5 | 0.5 | 1,350 | 1,219 | 3,990 | 4,022 | 1,707 |
| | | 0.99 | 0.01 | 1,200 | 1,180 | 4,110 | 4,050 | 1,715 |
| 0.25 | 0.25 | 0.25 | 0.25 | 1,380 | 1,111 | 4,150 | 4,110 | 2,321 |

Note *For Comparison

Referring particularly to the FIGURE, there is shown a block diagram of a circuit employed for measurements of dielectric characteristics of the ceramics in the microwave frequency range. The measuring method according to the above described circuit is explained in detail, for example, in B. W. Hakki et al. IRE Trans. MTM-14, 9, 400(1966), and is capable of precisely measuring dielectric constant, loss, stability against temperature, etc., of the dielectric ceramics in the microwave frequency range. On the basis of the method as described above, the present inventors took measurements on samples formed into cylindrical configuration, and each having dimensions of 5 to 6 mm in diameter and 2 to 2.5 mm in thickness, at measuring frequency of approximately 11.5 GHz, while the dielectric constant was determined from the sample size and resonant frequency. Additionally, the temperature coefficient for the resonant frequency was obtained from variation of the resonant frequency in temperatures between −20° C. and 100° C. The TCF can be represented by the following equation through employment of temperature coefficient of dielectric constant TCK and thermal expansion coefficient $\alpha l$.

$$TCF = -(TCK/2 + \alpha_l)$$

The value TCF is extremely useful as one of the characteristics representing temperature stability of the materials to be use in microwave circuits. For example, when the dielectric resonator is constituted by using the ceramics as described above, the stability of the resonant frequency is shown by the value TCF, while the loss is represented by 1/Q from the unloaded Q value, and the larger the value of Q, the lower is the loss.

The composition of the dielectric material according to the present invention may be represented by $3BaO \cdot M'O \cdot M_2''O_5$ as a whole, wherein M' denotes Zn or Mg, while M" shows Nb or Ta. It is to be noted here that the ceramics according to the present invention are solid solution containing at least two of either M' or M" of the above described components, and that compositions having one each of M' and M" are not included in the present invention.

The compositions according to the present invention can be obtained by mixing the starting material with oxides, carbonates, and hydroxides respectively containing Ba, Zn, Mg, Nb and Ta so as to form a predetermined composition. The resultant mixture is subsequently subjected to calcining for more than 30 minutes at temperatures between 1,000° to 1,400° C., and after water-grinding and drying, further subjected to hot-pressing calcining for at least more than 30 minutes under a pressure over 50 kg/cm² at temperatures from 1,200° C. to 1,450° C. to obtain the desired ceramics. It should be noted here that in the manufacturing process as described above, if the temperature for the calcining exceeds 1,400° C., electrical characteristics of the resultant ceramics tend to be deteriorated due to increase of the evaporation amount of BaO and ZnO in the material, while increasing the hot-pressing temperature over 1,450° C. is not desirable since cracks may be formed in the sample ceramics or dies for hot-pressing may be heavily deteriorated. Meanwhile, the time for calcining or that for hot-pressing should not be decreased lower than 30 minutes to avoid undesirable increase of deviations in the characteristics of the resultant ceramics. Similarly, at hot-pressing temperatures lower than 1,200° C. or under pressures lower than 50 kg/cm², ceramics of high quality can not be obtained due to poor calcining characteristics, while at the calcining temperatures under 1,000° C. and over 1,400° C., the value tends to be deteriorated.

According to the present invention, the dielectric ceramics having large dielectric constant, low loss against microwaves and good stability against temperature variations can be obtained by processing under the conditions as disclosed in the appended claims.

The following examples are inserted for the purpose of illustrating the present invention, without any intention of limiting the scope thereof, and the effect of the calcining temperature will be described in Example II with reference to Table 2 referred to earlier.

EXAMPLE I

Starting materials blended to form a predetermined composition were subjected to wet mixing with the use of distilled water. The resultant mixture was subjected to calcining for 2 hours at a temperature of 1,100° C. for subsequent water-grinding and drying, and then molded under a pressure of 700 kg/cm². The resultant molded material was subsequently subjected to hot-press calcining for 2 hours under a pressure of 200 kg/cm² by employing the die made by silicon carbide, i.e., SiC. The compositions and hot-pressing temperature in the experiment are tabulated in Table 1. As is seen from Table 1, the ceramics obtained by the compositions within the scope of the present invention have dielectric constants between 27 to 40, unloaded Q values over 3,900 and stability against temperature variations between 0 ppm/° C. and 28 ppm/° C. which are sufficiently small.

In addition, according to the method of the present invention, by properly selecting the compositions, ceramics having large unloaded Q value on the microstrip line of alumina substrates, for example, those having the unloaded Q value over 4,000 as shown in experiment number 6 in Table 1 can be obtained, with the stability TFC against temperature variations being of any value between 0 ppm/° C. and 28 ppm/° C. as desired.

EXAMPLE II

In Example II, only the calcining temperature was altered, with other processing conditions being exactly the same as those in Example I described above. The unloaded Q values in Example II are shown in Table 2. It will be noticed from Table 2 that at the calcining temperatures under 900° C. or over 1,400° C., the unloaded Q values are extremely deteriorated and the resultant ceramics are not suitable for microwave dielectric ceramics.

As is clear from the foregoing description, according to the present invention, low microwave loss dielectric ceramics having large dielectric constant and suitable for use as dielectric resonators, electrical filters, substrates, etc., are prepared from calcined material having compositions including at least two kinds of the components $3BaO \cdot ZnO \cdot Nb_2O_5$, $3BaO \cdot ZnO \cdot Ta_2O_5$, $3BaO \cdot MgO \cdot Nb_2O_5$, and $3BaO \cdot MgO \cdot Ta_2O_5$ and produced by the novel method as described hereinbefore, and disadvantages inherent in the conventional ceramics and the manufacturing methods therefor have advantageously been eliminated.

Although the present invention has been fully described by way of example with reference to Examples and accompanying drawing, it is to be noted that various changes and modifications are apparent to those skilled in the art. Therefore, unless otherwise such changes and modifications depart from the scope of the present invention, they should be construed as included therein.

What is claimed is:

1. A low microwave loss ceramic consisting essentially of a solid solution represented by the formula $$w(3BaO \cdot ZnO \cdot Nb_2O_5) - x(3BaO \cdot ZnO \cdot Ta_2O_5)$$

where $w$ and $x$ represent mole fraction and $0.01 \leq w \leq 0.99$, $0.01 \leq x \leq 0.99$ and $w + x = 1$, said ceramic having an unloaded Q value higher than that of each of the individual components in the solid solution.

2. A low microwave loss ceramic consisting essentially of a solid represented by the formula $$w(3BaO \cdot ZnO \cdot Nb_2O_5) - y(3BaO \cdot MgO \cdot Nb_2O_5)$$

where $w$ and $y$ represent mole fraction and $0.01 \leq w \leq 0.99$, $0.01 \leq y \leq 0.99$ and $w + y = 1$, said ceramic having an unloaded Q value higher than that of each of the individual components in the solid solution.

3. A low microwave loss ceramic consisting essentially of a solid solution represented by the formula $$x(3BaO \cdot ZnO \cdot Ta_2O_5) - z(3BaO \cdot MgO \cdot Ta_2O_5)$$

where $x$ and $z$ represent mole fraction and $0.01 \leq x \leq 0.99$, $0.01 \leq z \leq 0.99$ and $x + z = 1$, said ceramic having an unloaded Q value higher than that of each of the individual components in the solid solution.

4. A low microwave loss ceramic consisting essentially of a solid solution represented by the formula $$y(3BaO \cdot MgO \cdot Nb_2O_5) - z(3BaO \cdot MgO \cdot Ta_2O_5)$$

where $y$ and $z$ represent mole fraction and $0.01 \leq y \leq 0.99$, $0.01 \leq z \leq 0.99$ and $y + z = 1$, said ceramic having an unloaded Q value higher than that of each of the individual components in the solid solution.

5. A low microwave loss ceramic consisting essentially of a solid solution represented by the formula $$w(3BaO \cdot ZnO \cdot Nb_2O_5) - x(3BaO \cdot ZnO \cdot Ta_2O_5) -$$
$$y(3BaO \cdot MgO \cdot Nb_2O_5) - z(3BaO \cdot MgO \cdot Ta_2O_5)$$

where $w$, $x$, $y$ and $z$ represent mole fractions and $0.01 \leq w \leq 0.97$, $0.01 \leq x \leq 0.97$, $0.01 \leq y \leq 0.97$ and $0.01 \leq z \leq 0.97$ and $w + x + y + z = 1$, said ceramic having an unloaded Q value higher than that of each of the individual components in the solid solution.

6. A method of making a low microwave loss ceramic of the formula $$w(3BaO \cdot ZnO \cdot Nb_2O_5) - x(3BaO \cdot ZnO \cdot Ta_2O_5)$$

($0.01 \leq w \leq 0.99$, $0.01 \leq x \leq 0.99$ and $w + x = 1$) in solid solution, said ceramic having an unloaded Q value higher than that of each of the individual components in the solid solution, said method comprising the steps of; calcining a mixture of the oxides, hydroxides, or carbonates of the metals to be contained in the ceramic to form a solid solution, at 1,000° C. to 1,400° C., for a period of at least 30 minutes; and then hot-pressing at a pressure of at least 50 kg/cm², at 1,100° C. to 1,450° C., for a period of at least 30 minutes.

7. A method of making a low microwave loss ceramic of the formula $$w(3BaO \cdot ZnO \cdot Nb_2O_5) - y(3BaO \cdot MgO \cdot Nb_2O_5)$$

($0.01 \leq w \leq 0.99$, $0.01 \leq y \leq 0.99$ and $w + y = 1$) in solid solution, said ceramic having an unloaded Q value higher than that of each of the individual components in the solid solution, said method comprising the steps of; calcining a mixture of the oxides, hydroxides, or carbonates of the metals to be contained in the ceramic to form a solid solution at 1,000° C. to 1,400° C., for a period of at least 30 minutes; and then hot-pressing at a pressure of at least 50 kg/cm², at 1,100° C. to 1,450° C., for a period of at least 30 minutes.

8. A method of making a low microwave loss ceramic of the formula $$x(3BaO \cdot ZnO \cdot Ta_2O_5) - z(3BaO \cdot MgO \cdot Ta_2O_5)$$

($0.01 \leq x \leq 0.99$, $0.01 \leq z \leq 0.99$ and $x + z = 1$) in solid solution, said ceramic having an unloaded Q value higher than that of each of the individual components in the solid solution, said method comprising the steps of; calcining a mixture of the oxides, hydroxides, or carbonates of the metals to be contained in the ceramic to form a solid solution, at 1,000° C. to 1,400° C., for a period of at least 30 minutes; and then hot-pressing at a pressure of at least 50 kg/cm², at 1,100° C. to 1,450° C., for a period of at least 30 minutes.

9. A method of making a low microwave loss ceramic of the formula $y(3BaO \cdot MgO \cdot Nb_2O_5)$-$z(3BaO \cdot MgO \cdot Ta_2O_5)$ ($0.01 \leq y \leq 0.99$, $0.01 \leq z \leq 0.99$ and $y + z = 1$) in solid solution, said ceramic having an unloaded Q value higher than that of each of the individual components in the solid solution, said method comprising the steps of; calcining a mixture of the oxides, hydroxides, or carbonates of the metals to be contained in the ceramic to form a solid solution, at 1,000° C. to 1,400° C., for a period of at least 30 minutes; and then hot-pressing at a pressure of at least 50 kg/cm², at 1,100° C. to 1,450° C., for a period of at least 30 minutes.

10. A method of making a low microwave loss ceramic of the formula $w(3BaO \cdot ZnO \cdot Nb_2O_5)$-$x(3BaO \cdot ZnO \cdot Ta_2O_5)$-$y(3BaO \cdot MgO \cdot Nb_2O_5)$-$z(3BaO \cdot MgO \cdot Ta_2O_5)$ ($0.01 \leq w \leq 0.97$, $0.01 \leq x \leq 0.97$, $0.01 \leq y \leq 0.97$ and $0.01 \leq z \leq 0.97$ and $w + x + y + z = 1$) in solid solution, said ceramic having an unloaded Q value higher than that of each of the individual components in the solid solution, said method comprising the steps of; calcining a mixture of the oxides, hydroxides, or carbonates of the metals to be contained in the ceramic to form a solid solution, at 1,000° C. to 1,400° C., for a period of at least 30 minutes; and then hot-pressing at a pressure of at least 50 kg/cm², at 1,100° C. to 1,450° C., for a period of at least 30 minutes.

* * * * *